United States Patent [19]
Yang

[11] Patent Number: 5,339,017
[45] Date of Patent: Aug. 16, 1994

[54] BATTERY CHARGE MONITOR

[76] Inventor: Tai-Her Yang, 5-1 Taipin St., Si-Hu Town, Dzan-Hwa, Taiwan

[21] Appl. No.: 903,503

[22] Filed: Jun. 24, 1992

[30] Foreign Application Priority Data

Jul. 3, 1991 [GB] United Kingdom ............... 9114382

[51] Int. Cl.⁵ ............................................... H02J 7/00
[52] U.S. Cl. ......................................... 320/13; 320/48; 340/636
[58] Field of Search ................ 320/5, 13, 14, 43, 44, 320/48; 340/636

[56] References Cited

U.S. PATENT DOCUMENTS

| | | | |
|---|---|---|---|
| 4,020,414 | 4/1977 | Paredes | 320/48 X |
| 4,027,231 | 5/1977 | Lohrmann | 320/48 X |
| 4,080,560 | 3/1978 | Abert | 340/636 X |
| 4,743,831 | 5/1988 | Young | 320/48 |
| 4,803,459 | 2/1989 | Ta | 340/636 X |
| 4,947,123 | 8/1990 | Minezawa | 320/48 X |
| 5,130,659 | 7/1992 | Sloan | 320/48 X |

Primary Examiner—Kristine L. Peckman
Attorney, Agent, or Firm—Leonard Bloom

[57] ABSTRACT

An arrangement for detecting the state of charge of a vehicle battery (B201) in an electrical system (Z201) of a vehicle comprises an array of diodes (BD201) arranged to detect the initial voltage drop across the load when energised by a switch (M201). Each diode in the array defines a predetermined forward voltage drop and the diodes are arranged to energise respective thyristors (S201 to S208) when they conduct. These thyristors energise respective LEDs (201 to 208) which form a bar graph display, whereby the greater the voltage drop across the load (Z201) the greater the number of diodes which conduct and the greater the number of LEDs which are illuminated. Accordingly the bar graph display indicates the state of charge of the battery.

6 Claims, 3 Drawing Sheets

BATTERY CHARGE MONITOR

BACKGROUND OF THE INVENTION

In determining the surplus power of a conventional storage battery without measuring the specific gravity of the electrolyte, it is necessary to measure the internal resistance of the battery. There is an existing voltage measuring method on the market, but this involves quite a high error rate. On the other hand, it is possible to measure the internal resistance of a battery using a current meter connected in parallel connected in series with a low-resistance load across the battery for approximating a short-circuit. Such type of measurement not only causes a big spark during operation, but it also causes the temperature of the battery and power cord to rise extremely quickly. The high power consumption is a waste, and it poses a significant danger for non-professionals who attempt it. It would be greatly advantageous to be able to detect a battery's surplus power by correlating the transient charge with internal resistance, which in turn gives an indication of surplus power.

SUMMARY OF THE INVENTION

Accordingly, it is an object of the invention to measure a transient charge corresponding to the internal resistance of the battery, said transient charge thereby giving an indication of surplus power.

It is another object to measure the above-described transient charge by employing a solid-state or electro-mechanical type switch device for temporarily switching a resistive and/or inductive load in parallel across the battery, and measuring the internal resistance of the battery indirectly from the transient charge current.

It is a further object to indicate the surplus power at an analog or digital display, or by outputting a reference signal to peripheral components or devices.

In accordance with the above-described objects, the invention provides a discharge circuit incorporating a capacitor and/or resistor load. In use, current from the battery is discharged into the load and the resulting voltage across the load is detected by an array of diodes which each define a predetermined forward voltage drop and respectively energize an array of LED's via corresponding varistors. The greater the initial current surge into the load, the lower the internal resistance of the battery and the greater the number of LED's illuminated in the bar graph display.

The battery charge monitor of the present invention may complete its measurements at random or preset periodic times, or it may accept operational commands from other equipment. charge.

DETAILED DESCRIPTION OF THE INVENTION

To determine the surplus power of a conventional storage battery, it is possible either to measure the specific gravity of electrolyte or to measure the internal resistance of the battery. The latter method is much easier.

Figure 1:
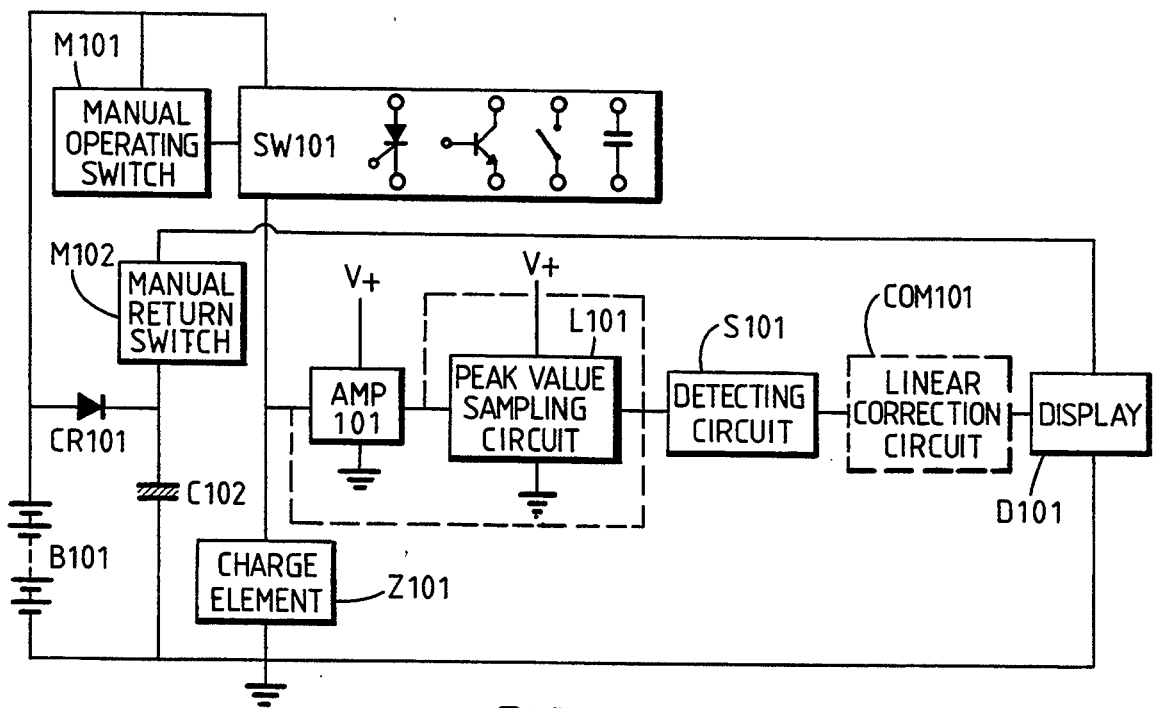
FIG. 1 is a block diagram showing the major components of a battery charging monitor for detecting surplus power of a battery by converting the transient charge internal resistance of the battery into surplus power according to the present invention.

The present invention is described in detail in company with attached drawings as follows:

FIG. 1 shows the block diagram of the present invention, including:

a storage battery B101 ready for measuring;

a switch device SW101 which may be a solid-state or electro-mechanical type switch device, provided for testing an open or closed circuit between the charge and storage battery B101;

display circuit D101 which may be a digital or continuous analog level-type display for providing a direct or numerical output in response to an input signal;

charging element Z101 connected in series with switch device SW101, the series-connected switch SW101 and charging element being connected in parallel across the positive and negative electrodes of storage battery B101. The selection of possible charging elements includes varistors or other conventional components with inductance and resistance or equivalent charging properties, including thermo-electric charge, motor charge or lighting charge;

manual-operating switch M101 connected to the control input of switch SW101 for operating the charge element Z101. The manual-operating switch also may be replaced by a suitable timing device or externally-controlled device for periodic or non-periodic operation;

manual-operating 0-return switch M102 provided for manually initiating a 0 return the 0-return switch M102 may also be replaced by a suitable timing device or externally-controlled device for periodic or non-periodic 0-return operation;

detecting circuit S101 for detecting the transient signal wave-form on each end of charging element Z101 and transmitting such data to the display circuit D101. The detecting circuit S101 preferably includes an analog-to-digital converter for transmitting a digital signal to a digital display circuit D101. Alternatively, detecting circuit S101 may directly transmit an analog signal to an analog display circuit D101. In the case of an analog signal, it may be necessary to include a conventional linear amplifier circuit AMP101 for producing a continuous output in response to an input differential wave form through conventional peak value sampling stick circuit L101 or transmitted to amplified and peak-value sampling circuit;

steady circuit including capacitance C102 (or an auxiliary battery) which is fed through a one-way diode CR101, thereby allowing power to be stored in the capacitance C102 (or auxiliary battery) through one-way diode CR101. This serves as a power supply for the display circuit D101 linear correction circuit COM101 connected between the detecting circuit S101 and display circuit D101. The linear correction circuit COM101 may comprise matrix elements or analog elements for linear display correction;

With the functions as indicated in the block diagram of FIG. 1, it becomes possible to obtain a more correct indication of the surplus power in the battery.

Figure 2A:
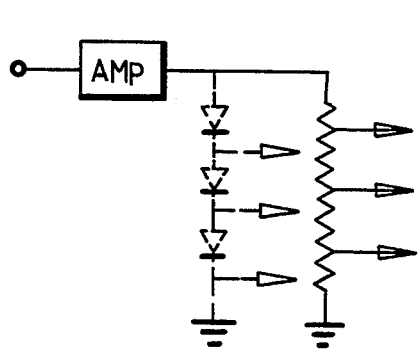
FIGS. 2A–2C are different configurations of the amplifier circuit and the level-type display circuit.
Figure 2B:
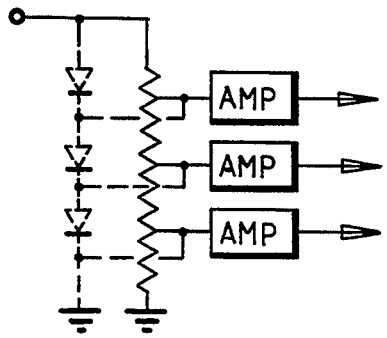
Figure 2C:
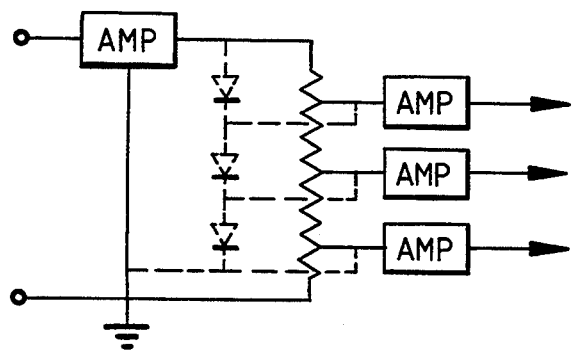
Figure 2:
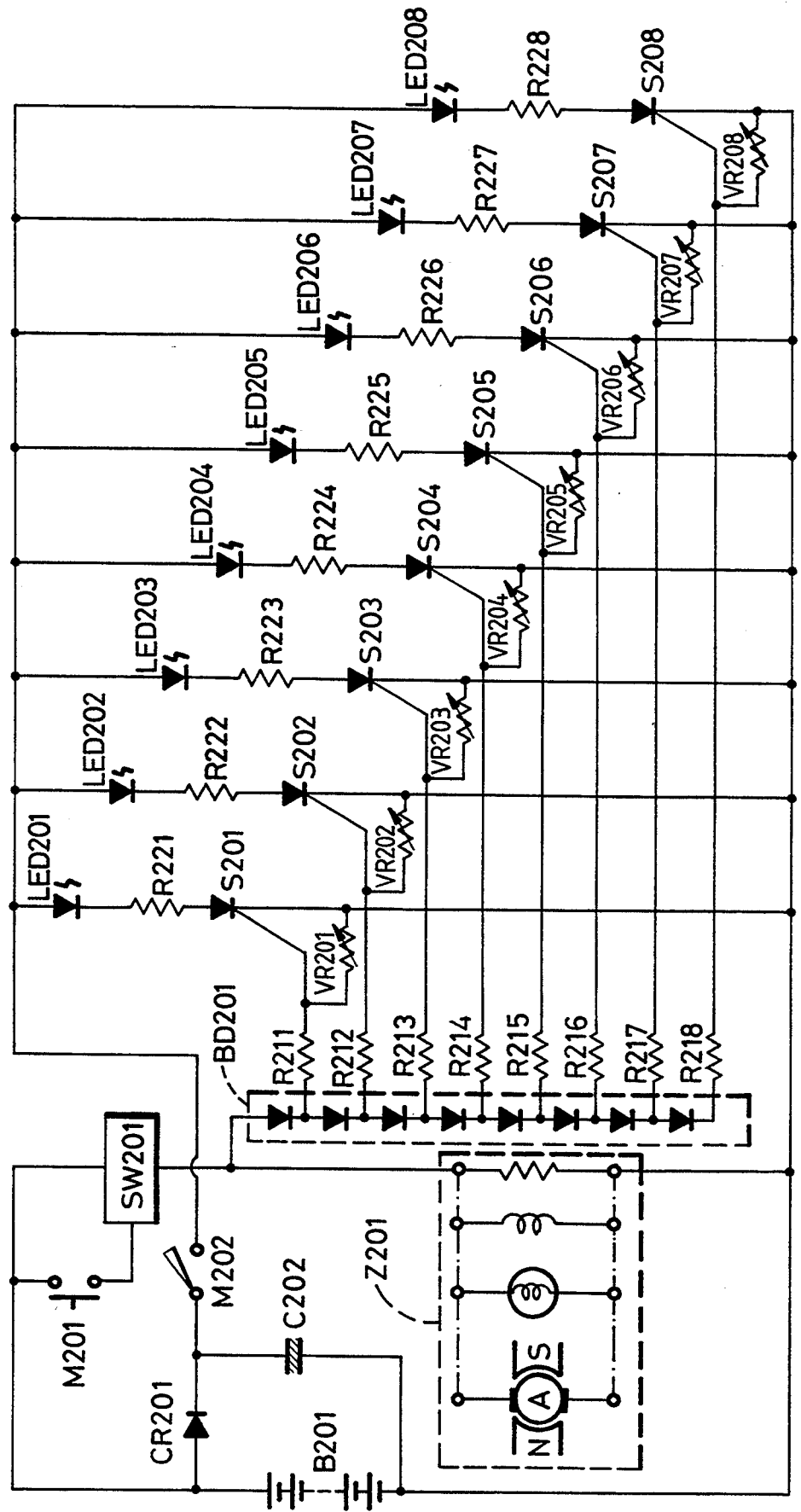
FIG. 2 is an embodiment of an analog display suitable for use as block D101 in FIG. 1.

FIG. 2 is a detailed embodiment of a battery charging monitor incorporating an analog level-type display circuit, with the elements and actions as follows:

switch device SW201 comprises a conventional solid-state or electro-mechanical for accepting trigger control signal from a trigger operating switch M201 to thereby enable electrical energy output from the battery B201 through the switch device SW201, which charging element Z201 and forms a transient charge current wave-form on each end of charging element Z201, and at the moment that switch device SW201 is switched ON, the signal value on each end of charging element Z201 is inversely proportional to the internal resistance of battery B201. We know that the lower the internal resistance of a battery, the larger the peak value of transient charge current, and the more surplus power left in the battery.

The aforesaid transient charge current signal is transmitted to the level-type display circuit D201 directly, or it is first amplified through an amplifier circuit, and its amplifier circuit and level-type display circuit. The amplifier circuit and level-type display circuit may be constructed as such:

(1) directly graded but no amplification of the input signal, the graded signal is transmitted directly to switch element SW201;

(2) amplify input signal and then grade it for transmitting it to stick switch element. This type of configuration is shown generally at FIG. 2.-A;

(3) after grading, then separately amplify and transmit to stick switch element (as shown in FIG. 2-B);

(4) jointly amplify and then grade and transmit to each individual stick switch element (as shown in FIG. 2-C);

manually-operated 0-return switch M202, which may be selectively closed for controlling power applied to the display unit. 0-return switch M202 can be operated to cut power off when the display unit returns to 0 under normal discharge. It should be noted that switch M202 also may be replaced by an externally-controlled circuit element operated by an external signal;

the positive end of charging element Z201 is connected to a series of diodes BD201 (or Zener diodes) which form a voltage level detecting circuit with positive bias VF of diodes D201 (or VZ of Zener diodes). When the peak value of transient charge current is greater than that of the forward bias voltage of series diodes BD201 (or bias value of Zener diodes), the signal current generates a level-type output through said diodes (or Zener diodes) and this serves the function of detecting circuit.

To generate a visual display, each level output tap is series connected to a limiter resistance R211–R218, and each discrete resistance value is able to operate the display circuit distribution of differential signals from charging element Z201;

Fixed or variable shunt resistances VR201–VR208 respectively, may be included as shown for adjusting the display levels.

Alternatively, diodes BD201 can be omitted and shunt resistances VR201–VR208 and limiter resistances R211–R218 provided for setting the display level values directly;

thyristor assemblies S201–208, respectively, are series connected to the light-emitting diodes LED201–208 through limiter resistances R221–R228, and the respective series-connections are all connected in parallel, the negative end of charging element Z201 jointly connected to the negative end of power supply, and the positive end leading to the positive end of power supply through the manually-operated 0-return switch M202. The gate of each thyristor assembly respectively passes through limiter resistances R211–R218 and is then respectively connected to each series connection of said detecting circuit series diodes BD201 (or Zener diodes).

This sequence of connections forms a multi-level display circuit, and the number of levels can be flexibly selected in accordance with the thyristors and bias values of diodes BD201 (or Zener diodes) subject to the peak voltage produced from charging element Z201 and trigger connected thyristor assembly. This enables the series connected light-emitting diodes LED to light the display. It is noteworthy that the detecting circuit (comprising said series diodes D201 or Zener diodes) and each thyristor also may include variable-level elements with characteristics such as different negative breakdown impedance. This can be accomplished with DIACs having different conductive voltage, or other like components in a level arrangement to replace level type detecting circuit and thyristor assembly. Likewise, the display unit may comprise other light-emitting elements besides LEDs for more continuous displays;

A steady-voltage circuit is also provided for storing power in capacitance C202 (or auxiliary battery) through one-way diodes CR201 under a normal state so as to offer power supply to display circuit continuously under normal state and during the moment of measuring when the battery bears instantaneous charge drops.

Figure 3:
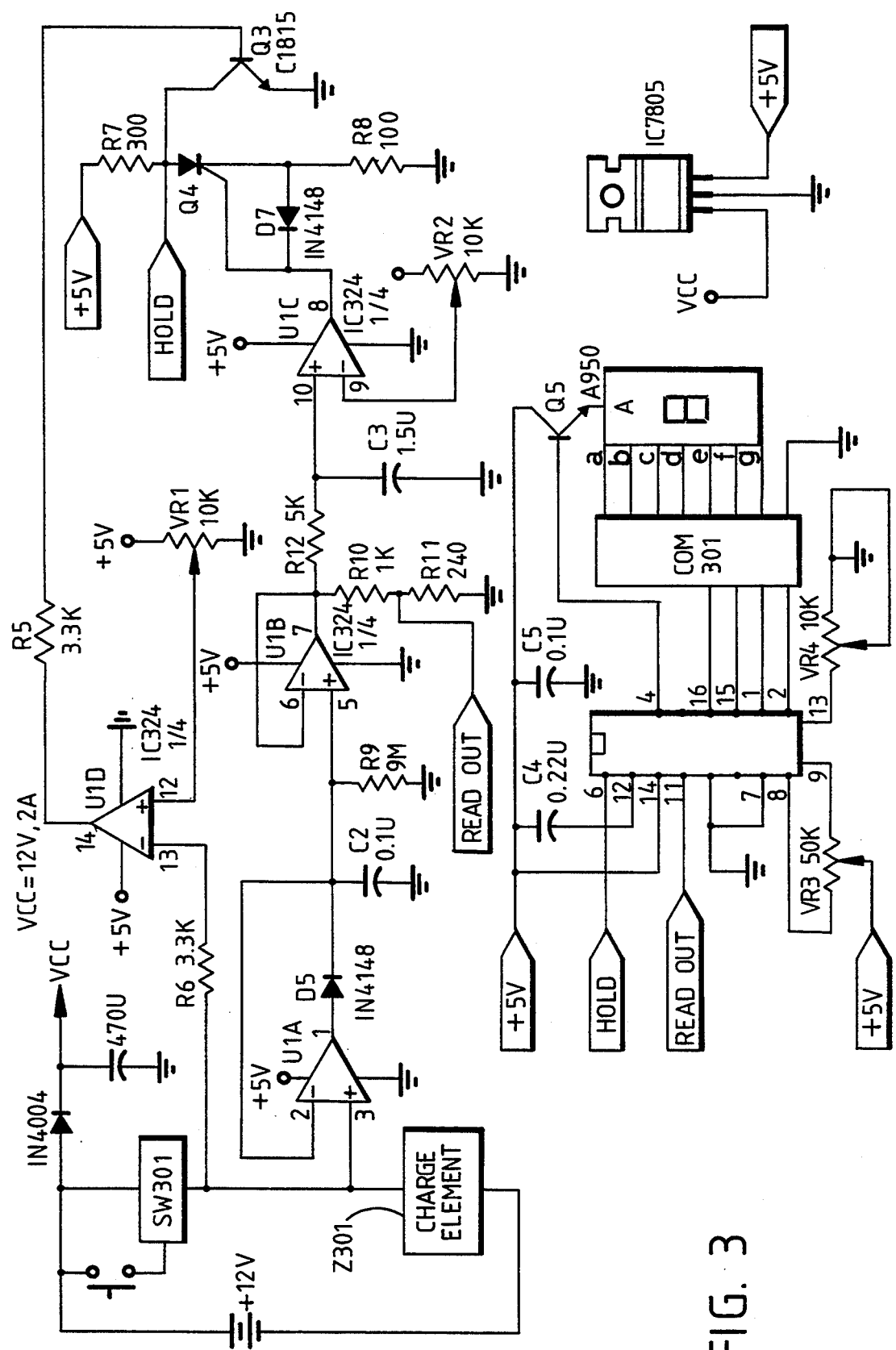
FIG. 3 is an alternative embodiment of a digital display suitable for use as block D101 in FIG. 1.

FIG. 3 illustrates an embodiment of a numerical display comprising:

switch SW101 as in the block diagram of FIG. i comprises solid-state or electro-mechanical type switch elements;

charging element Z101 as in FIG. I is now designated as charging element Z301;

a linear amplifier forms the detecting amplifying circuit (as CA 3162 E and CA 3161 E generally applied to digital current meter) comprises A/D Converter and Latch and Decoder;

intermediate interface switch elements including electro-mechanical or solid-state switches are provided for matching CA3162 E and thereby operating input, latch and synchronous sampling time;

digital display elements;

an operating switch including start switch and 0-return discharge switch elements as in FIG. 1;

essential secondary peripheral devices to the steady-voltage power supply and circuit—such as resistances, capacitors, diodes for protection, etc.;

linear correction circuit COM301 is an error correction circuit comprising matrix elements. This is provided for more precise measurements linear display correction.

In addition, we may parallely connect the detecting capacitor of said measuring circuit to the discharge resistance so as to detect the internal resistance transient state of the battery, thereby displaying surplus power indirectly when the discharge is ended and detecting circuit is restarted.

It should be noted that this is only an example, and that one may also effect periodic measuring by adding a timer for initiating 0-return operation and starting the switch.

To conclude the above description, the battery charge monitor for measuring surplus power according to the present invention makes the method of measuring surplus power easy and feasible.

I claim:

1. An arrangement for detecting and indicating the state of charge of a rechargeable battery, the arrangement comprising a discharge circuit arranged to be connected to terminals of the battery, the discharge circuit including a switch in series with a load, said load further comprising an electrical system of a motor vehicle including a starter motor of said vehicle, and means for detecting an initial voltage drop across said load, said voltage drop being dependent upon the internal resistance of the battery, and the arrangement further comprising a display device which is responsive to said voltage drop and arranged to display the state of charge of the battery.

2. An arrangement as claimed in claim 1 including means in said discharge circuit for intermittently controlling said switch to remove current through said load.

3. An arrangement as claimed in claim 1 wherein said detecting means comprises an array of series-connected diodes, the diodes being similarly poled and each defining a forward voltage drop, the junctions of the diodes being connected to respective bypass resistors whereby the number of diodes in the array which conduct in response to the application of a voltage drop across said array depends on the magnitude of said voltage drop across said array, the display being responsive to the number of diodes which conduct.

4. An arrangement as claimed in claim 3 wherein said display comprises a plurality of light-emitting diodes (LEDs) which are connected in parallel and arranged to be switched on individually in response to current passing through respective ones of said bypass resistors.

5. An arrangement as claimed in claim 4 wherein said light-emitting diodes are arranged to be switched on by respective gate-controlled semiconductor switching devices whose gate electrodes are connected to respective ones of said bypass resistors.

6. An arrangement as claimed in claim 1, further comprising a storage capacitor connected to the rechargeable battery for charging thereby, said storage capacitor charging to a voltage which is substantially unaffected by discharge of the battery through said discharge circuit, the detecting means being energized by said substantially unaffected voltage.

* * * * *